United States Patent [19]
Yokoto et al.

[11] Patent Number: 4,777,523
[45] Date of Patent: Oct. 11, 1988

[54] ELECTRON MICROSCOPE WITH TELEVISION OBSERVATION APPARATUS

[75] Inventors: Takashi Yokoto; Toshiyuki Ohashi, both of Katsuta, Japan

[73] Assignee: Hitachi, Ltd., Tokyo, Japan

[21] Appl. No.: 103,704

[22] Filed: Oct. 2, 1987

[30] Foreign Application Priority Data

Oct. 3, 1986 [JP] Japan ............................. 61-234440

[51] Int. Cl.4 ............................................. H04N 7/18
[52] U.S. Cl. ....................................... 358/93; 250/311
[58] Field of Search ................. 358/93, 225; 250/310, 250/311

[56] References Cited

U.S. PATENT DOCUMENTS 3,835,246  9/1974  Muller et al. ........................ 358/93
4,494,000  1/1985  Shii et al. ............................ 250/311
4,626,906 12/1986  Ensor .................................. 358/93

FOREIGN PATENT DOCUMENTS 0054158  3/1984  Japan ................................. 250/311
2118771 11/1983  United Kingdom ................ 250/311

OTHER PUBLICATIONS

Image Engineering 7.2 Television, Corona Publishing, Ltd.

Primary Examiner—Howard W. Britton
Assistant Examiner—Victor R. Kostak
Attorney, Agent, or Firm—Antonelli, Terry & Wands

[57] ABSTRACT

An electron microscope with a television observation apparatus is equipped such that an observation image of the electron microscope on a television fluorescent screen and an image displayed on a cathode-ray tube through taking-in of the electron microscope observation image by a television camera are conformed to each other in up/down and right/left directions and composition. This can be realized by making the polarity of a deflection electrode of the television camera or a deflection electrode of the cathode-ray tube in a horizontal scanning direction reverse to a usual polarity, or by interposing an odd number of reflectors between the television fluorescent screen and the television camera.

7 Claims, 4 Drawing Sheets

ELECTRON MICROSCOPE WITH TELEVISION OBSERVATION APPARATUS

BACKGROUND OF THE INVENTION

The present invention relates to an electron microscope with a television (hereinafter referred to as TV) observation apparatus, and more particularly to a transmsssion type of electron microscope with a TV observation apparatus with a TV camera mounted thereto which apparatus can conform the directions of as well as the compositions (or constructions) of an object (TEM image) and a TV image to each other.

An observation method in the conventional electron microscope with TV observation apparatus will now be explained by virtue of FIG. 7. An electron beam 6 of a TV camera (image pickup tube) scans the rear surface of a photoconductive plate 5a (onto which a TEM image obtained by the electron microscope is optically focused), starting from a left and upper point thereof and travelling to X (or horizontal) and Y (or vertical) directions. The deflection of the electron beam 6 is effected by a deflection electrode 5b of the TV camera. In the TV camera, the scanning is usually carried out in an interlace mode. After the scan of one image, the scan is returned to the left and upper starting point for taking in the next image and reading is made again along the same path of travel.

A phosphor screen of a receiver cathode-ray tube 8 is scanned in synchronism with the deflection frequency of the TV camera through a transfer unit 7 to display a TV image on the cathode-ray tube.

For example, provided that the TEM image of the electron microscope has the form of ꟼ being a mirror image of a character F and it is projected on the upper surface of a fluorescent screen 4 for TV as it is, an image in the form of ꟼ is also formed on the front surface of the photoconductive plate 5a but the electron beam 6 scanning the rear surface of the photoconductive plate 5a scans this image as an image 9a which assumes the form of F. As a result, an image 9c in the form of F is displayed on the cathode-ray tube 8. Thus, the TEM image or object ꟼ and the image or character F observed by the cathode-ray tube 8 has a mirror image relation therebetween in which those image compositions are reversed to each other. The similar effect is described in a book entitled "Story about Electronic Imaging" published by the Nikkan Kogyo Newspapers.

In the above-mentioned prior art, since the TEM image on the fluorescent screen of the electron microscope is taken in in a usual manner by the TV camera from the rear surface of the fluorescent screen, there is a problem that the TV image displayed on the cathode-ray tube has a mirror image relation with respect to the TEM image obtained by the electron microscope or its composition reverse to the TEM image composition, thereby resulting in great inconveniences in manipulation of the electron microscope.

SUMMARY OF THE INVENTION

An object of the present invention is to provide an electron microscope with a TV observation apparatus in which a TEM image observed by the electron microscope and a TV image observed by a TV camera can be conformed to each other in vertical (up and down) and horizontal (right and left) directions and composition.

According to an embodiment of the present invention, the above object can be achieved, for example, by making the polarity of an electron beam deflection electrode of the TV camera in a horizontal or X scanning direction reverse to a usual polarity to change the scanning direction of an electron beam so that the electron beam which otherwise starts from the left and upper side toward the right, starts from right and upper side toward the left.

According to another embodiment of the present invention, the conformity of the TEM image to the TV image can be realized by interposing reflector means between means for converting an electron beam image into an optical image and the TV camera so that the optical image is mirror-reflected an odd number of times to conform the TEM image and the TV image and thereafter transferred to the TV camera.

DESCRIPTION OF THE PREFERRED EMBODIMENTS

The present invention will now be described referring to embodiments by use of FIGS. 1 to 6.

Figure 1:
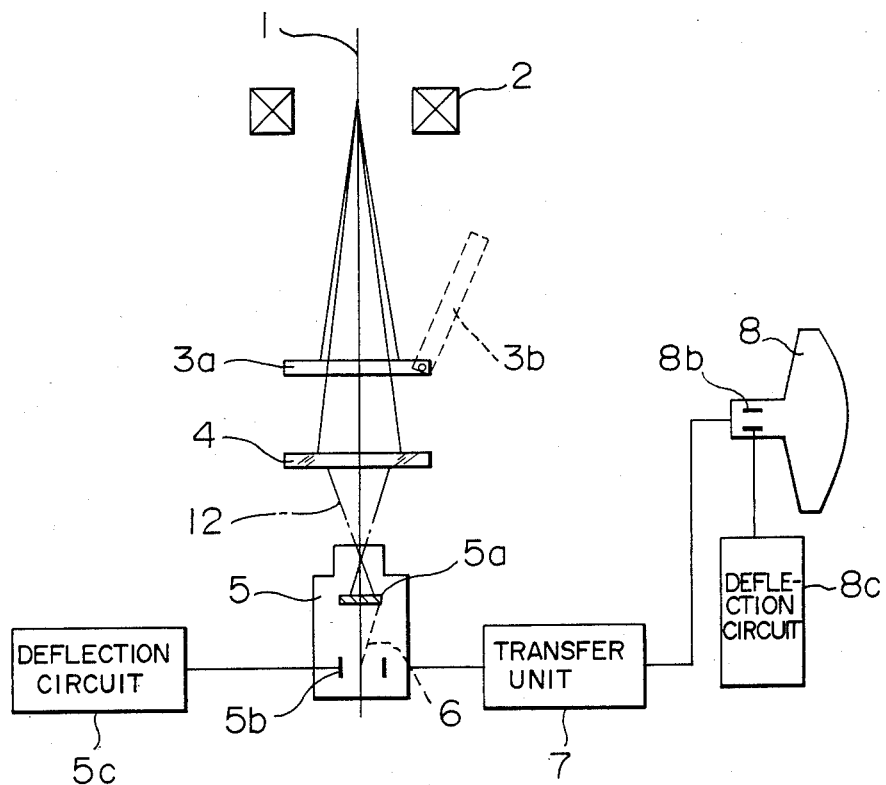
FIG. 1 is a schematic diagram of an electron microscope with a TV observation apparatus according to an embodiment of the present invention which is mounted to the electron microscope.

Referring to FIG. 1 showing a schematic diagram of an electron microscope with a TV observation apparatus according to an embodiment of the present invention, an electron beam 1 of the electron microscope transmitted through a specimen (not shown) is enlarged by an imaging lens 2 and converted into visible rays by a fluorescent screen 3a to obtain a TEM image. When it is desired to display this TEM image as a TV image on a cathode-ray tube 8, the fluorescent screen 3a for TEM image observation is opened as shown by dotted line 3b so that the TEM image is reproduced or focused on a fluorescent screen 4 for TV. The TEM image optically converted by the TV fluorescent screen 4 is taken in by a TV camera 5 from the rear surface side of the fluorescent screen 4 to make an optical image on a photoconductive plate 5a. The photoconductive plate 5a is scanned with a deflection electron beam 6 in synchronism with the television frequency. The horizontal and vertical scanning is effected by a deflection electrode 5b to which a predetermined current is supplied from a deflection circuit 5c. A signal converted into an electrical signal by the photoconductive plate 5a scans a phosphor screen of a receiver cathode-ray tube 8 through a transfer unit 7 to produce or display an TV image thereon. Here, it should be noted that according to the teaching of the present invention the polarity of the deflection electrode 5b in a horizontal direction is reversed so that the horizontal scan for the photoconductive plate 5a is effected from a right and upper point on the rear surface of the photoconductive plate 5a toward the left in contrast to the usual or conventional scan. This can be easily and surely obtained by merely altering the polarity in a horizontal scanning direction of the deflection electrode 5b connected to the deflection circuit 5c into a reverse polarity to a usual polarity.

Figure 2:
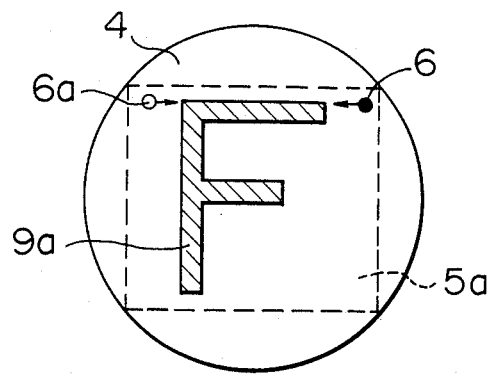
FIG. 2 is a view showing an example of an image formed on a TV fluorescent screen of FIG. 1 when seen from the upper side.
Figure 3:
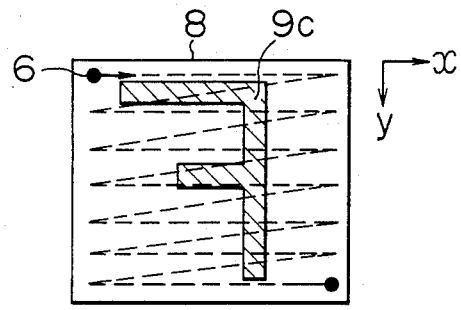
FIG. 3 is a view showing an example of a TV image obtained by the conventional TV observation apparatus.
Figure 4:
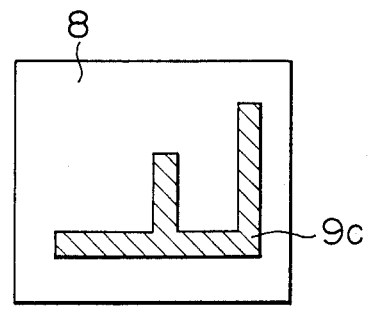
FIG. 4 is a view showing an example of a TV image at a position where the mounting angle of a TV camera is rotated in a clockwise direction by 90°.
Figure 5:
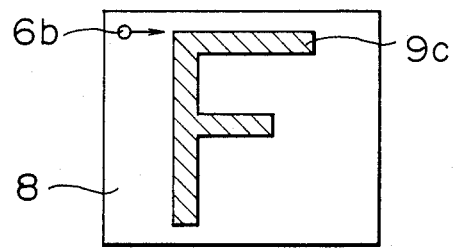
FIG. 5 is a view showing an example of a TV image obtained according to the embodiment of FIG. 1 in which the polarity of a deflection electrode of a TV camera in a horizontal scanning direction is made reverse to a usual polarity.

FIG. 2 is a view showing a situation when a TEM image 9a of a character F formed on the fluorescent screen 4 shown in FIG. 1 is seen from the upper or image projection side. This TEM image is taken in by the TV camera 5 at a state in which it is seen from the rear of the drawing paper. In the conventional approach, it is scanned from the rear surface of the photoconductive plate 5a, as indicated by an electron beam 6 in FIG. 2. When an image by the conventional electron beam 6 thus scanned is received by the cathode-ray tube 8, an image 9c in the form of ꟻ being a mirror image of the character F is observed on the cathode-ray tube 8, as is shown in FIG. 3. Also, when the taking-in of the TEM image 9a by the TV camera 5 is made at a position where a mounting angle of the photoconductive plate 5a of the TV camera 5 with respect to the fluorescent screen 4 is rotated by 90° in a clockwise direction from the position shown in FIG. 2, such an image 9c as shown in FIG. 4 is displayed on the cathode-ray tube 8. According to the present invention, therefore, the TV camera 5 is mounted with respect to the fluorescent screen 4 as shown in FIG. 2 or with such a mounting direction that a scanning direction of the electron beam 6 takes the direction shown in FIG. 2, but in order that not the mirror image shown in FIG. 3 but a positive image is displayed on the cathode-ray tube 8, the polarity of the deflection electrode 5b of FIG. 1 in a horizontal or X scanning direction is made reverse to a usual polarity so that the scanning electron beam 6 starts to from a position 6a shown in FIG. 2. With such a construction, a TV image 9c conformable to the TEM image 9a in direction and composition is obtained, as is shown in FIG. 5.

Though in the foregoing embodiment the polarity of the deflection electrode 5b of the TV camera 5 in the horizontal direction has been made reverse to a usual polarity, a similar effect can be obtained in such a manner that the polarity of an electron beam deflection electrode 8b of the cathode-ray tube 8 in a horizontal scanning direction to which a deflection circuit 8c of the cathode-ray tube 8 is connected, is made reverse to a usual polarity.

Figure 6:
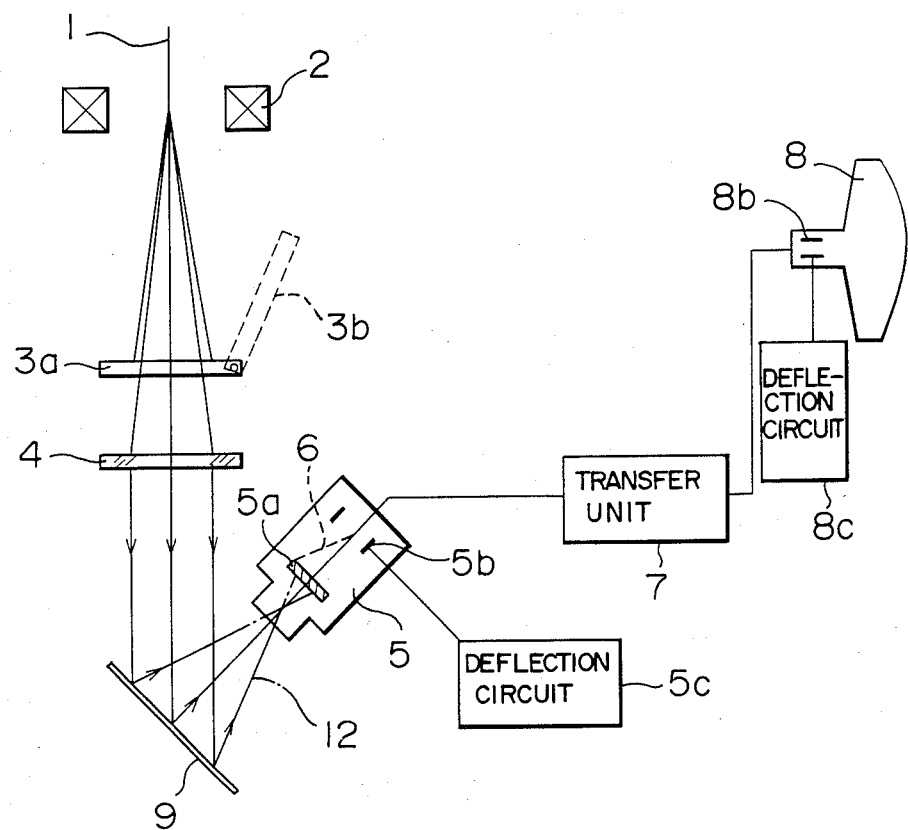
FIG. 6 is a schematic diagram of an electron microscope with a TV observation apparatus according to another embodiment of the present invention in which a reflector is interposed between a TV fluorescent screen and a TV camera.
Figure 7:
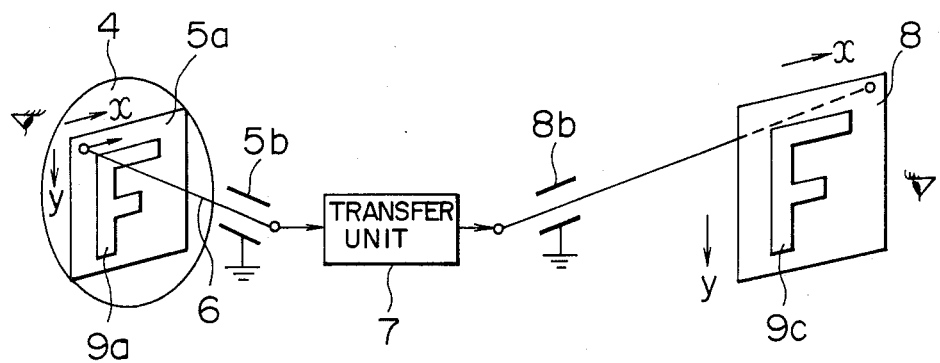
FIG. 7 is a view useful in explaining an observation method in the conventional electron microscope with TV observation apparatus.

FIG. 6 shows another embodiment of the present invention in which a reflecting plate or reflector 9 such as a mirror is used. The reflector 9 is disposed below the TV fluorescent screen 4 so that a mirror image on the rear surface of the TV fluorescent screen 4, which is a mirror image of the TEM image formed on the front surface of the TV fluorescent screen 4, is taken in by the TV camera 5 through the reflector 9 which in turn provides a mirror image of the mirror image of the rear surface of the fluorescent screen 4 and conforms to the TEM image on the front surface of the fluorescent screen 4. Thus, the reflector 9 is used to invert or mirror-reflect the mirror image of the TEM image so that the TEM image can be displayed as a real image on the cathode-ray tube 8.

In the embodiment shown in FIG. 6, one reflector 9 has been used. However, depending on the requirements in construction of the apparatus, an odd number of reflectors 9 can be used in combination between the TV fluorescent screen 4 and the TV camera 5 so as to provide a mirror-reflecting transfer path of the TEM image with an odd number of reflectors to conform the image viewed by the TV camera to the TEM image. The reflector may be a mirror or prism.

As has been described in the above, according to the present invention, an observation image of the electron microscope on the TV fluorescent screen and an observation image of the cathode-ray tube obtained by taking in the electron microscope image by the TV camera can be conformed to each other in up/down and right/left directions and composition. Therefore, there is provided an effect that the manipulation including changeover between the observation of the TEM image by the electron microscope and the observation thereof as a TV image by the cathode-ray tube can be facilitated.

We claim:

1. An electron microscope with a television observation apparatus including means for generating and accelerating an electron beam, means for irradiating a specimen with said electron beam, means for enlarging and focusing the electron beam transmitted through said specimen, and means for converting an image of the enlarged focused electron beam into a TEM image on a front surface thereof, said television observation apparatus comprising:
   a television camera for taking in an image of said TEM image from a rear surface of said converting means;
   means for displaying the image taken in by said television camera; and
   means for inverting the direction and composition of the image displayed by said displaying means to those of said TEM image on the front surface of said converting means.

2. An electron microscope with a television observation apparatus according to claim 1, wherein said inverting means includes means for making the polarity of a deflection electrode of said television camera in a horizontal scanning direction reverse to a usual polarity.

3. An electron microscope with a television observation apparatus according to claim 1, wherein said displaying means includes a cathode-ray tube.

4. An electron microscope with a television observation apparatus according to claim 3, wherein said inverting means includes means for making the polarity of a deflection electrode of said cathode-ray tube in a horizontal scanning direction reverse to a usual polarity.

5. An electron microscope with a television observation apparatus according to claim 1, wherein said inverting means includes reflector means for mirror-reflecting an odd number of times said image taken from the rear surface of said converting means so that the odd number of times mirror-reflected image conforms to said TEM image and thereafter transferring it to said television camera.

6. An electron microscope with a television observation apparatus according to claim 1, wherein said image of said TEM image on the rear surface of said converting means is a mirror image of said TEM image on the front surface of said converting means.

7. An electron microscope with a television observation apparatus according to claim 6, wherein said inverting means inverts the direction and composition of the image displayed by said display means to a mirror image of said mirror image of said TEM image on the rear surface of said converting means so that the displayed image conforms to said TEM image on the front surface of said converting means.

* * * * *